(12) United States Patent
Inoue et al.

(10) Patent No.: US 7,247,904 B2
(45) Date of Patent: Jul. 24, 2007

(54) SEMICONDUCTOR DEVICE MEMORY CELL

(75) Inventors: Tomoko Inoue, Kanagawa (JP); Ken Inoue, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/409,094

(22) Filed: Apr. 24, 2006

(65) Prior Publication Data

US 2006/0186448 A1    Aug. 24, 2006

Related U.S. Application Data

(62) Division of application No. 10/876,548, filed on Jun. 28, 2004, now Pat. No. 7,105,882.

(30) Foreign Application Priority Data

Jun. 30, 2003   (JP)   ............................. 2003-187496
Feb. 18, 2004   (JP)   ............................. 2004-041280

(51) Int. Cl.
    *H01L 27/108*    (2006.01)
    *H01L 29/76*    (2006.01)
    *H01L 29/94*    (2006.01)
    *H01L 31/119*    (2006.01)

(52) U.S. Cl. ...................... 257/296; 257/303; 257/306

(58) Field of Classification Search ................ 257/296, 257/303, 306–310
See application file for complete search history.

(56) References Cited

U.S. PATENT DOCUMENTS 6,548,845 B1 *   4/2003   Koike ........................ 257/296
6,737,694 B2     5/2004   Kim et al.

FOREIGN PATENT DOCUMENTS

JP      2002-231906     8/2002
JP      2003-7854     1/2003

* cited by examiner

*Primary Examiner*—Hoai Pham
(74) *Attorney, Agent, or Firm*—Young & Thompson

(57) ABSTRACT

A circuit provides an inhibition to the short circuit between the bit line and the capacitance contact, without employing a self alignment contact (SAC) process. A hard mask is formed on the bit line upper surface and a side wall formed on the side surface of the bit line by etching back a nitride film. A bit contact interlayer film without the SAC structure is etched off except where bit line is formed. A direct nitride film is formed on the entire top and side surface of the bit line so as to cover the bit line in one processing step. Since the upper and side nitride film thicknesses are substantially the same, the height of the bit line can be reduced, enabling further miniaturization. In addition, since the sidewall nitride film is formed without an etch back process, it can more easily be formed with a constant film thickness.

11 Claims, 12 Drawing Sheets

TRANSISTOR FOR MEMORY CELL

PRIOR ART

SEMICONDUCTOR DEVICE MEMORY CELL

This application is a divisional of application Ser. No. 10/876,548, filed on Jun. 28, 2004, now U.S. Pat. No. 7,105,882, the entire contents of which are hereby incorporated by reference.

BACKGROUND OF THE INVENTION

1. Field of the Invention

The present invention relates to a semiconductor device and method for manufacturing thereof.

2. Description of Related Art

A memory cell composing DRAM generally composed of a transistor for the memory cell and a capacitance element. Capacitor over bit line (COB) DRAM having a structure, in which a capacitance element of DRAM is disposed above a bit line, is proposed for achieving higher degree of integration of the memory cell. Typical conventional structure of such COB DRAM is shown in FIG. 18.

In this type of the conventional DRAM, a MOS transistor formed on a semiconductor substrate such as a silicon substrate 10 or the like functions as a transistor for memory cell. A bit line 6 is formed on an upper layer of the transistor for the memory cell via a cell contact interlayer film 8, and a capacitance element 11 is formed on an upper layer of the bit line 6 via a capacitance contact interlayer film 7. The bit line 6 is coupled to a transistor for memory cell formed on the silicon substrate 10 by being coupled through a barrier metal layer 5 to a cell contact 9, and the capacitance element 11 is coupled to the transistor for memory cell formed on the silicon substrate 10 through the capacitance contact 4 and the cell contact 9.

Although FIG. 18 illustrates the barrier metal layer 5 provided as an underlying layer disposed under the bit line 6, it is intended to additionally include the barrier metal layer 5 when the term "bit line 6" appears in the following description.

In such structure, it is designed to include a configuration of maintaining a predetermined spacing between the bit line 6 and the capacitance contact 4 or the cell contact 9, in order to inhibit a generation of electric short circuit. However, the progresses in increasing the level of the integration in the semiconductor devices necessarily reduce the room for the spacing between the bit line 6 and the cell contact 9 or the capacitance contact 4, a short circuit may be occurred between the bit line 6 and the cell contact 9 or the capacitance contact 4 by a misalignment caused in the formation of the bit line 6 or a misalignment caused in the formation of the capacitance contact 4 or the like. When the short circuit is occurred between the bit line 6 and the cell contact 9 or the capacitance contact 4 as described above, failure occurs in the resultant memory cell, thereby reducing the yield of DRAM.

Thus, a semiconductor device additionally including a bit contact interlayer film 13 formed on the cell contact interlayer film 8 is proposed, in order to inhibit the short circuit between the bit line 6 and the cell contact 9. The constitution of such conventional semiconductor device is shown in FIG. 19. In this type of conventional semiconductor device, a bit contact interlayer film 13 is formed after forming the cell contact interlayer film 8, and a bit contact 14 is formed on a portion of the bit contact interlayer film 13 in order to couple the cell contact 9 to the bit line 6. Having such structure, larger room for the spacing for preventing the short circuit between the upper end of the cell contact 9 and the bit line 6 can be acquired. However, sufficient level of inhibition for the short circuit between the bit line 6 and the capacitance contact 4 can not be obtainable by employing such structure.

A semiconductor device having a configuration for inhibiting the short circuit between the capacitance contact 4 and the bit line 6 includes, as shown in FIG. 20, a self-aligned (or self-alignment) contact structure comprising a side wall 17 formed on a material such as silicon nitride film or the like having an etch selectivity against the capacitance contact interlayer film 4 on the side surface of the bit line 6 is proposed (see, for example, JP-A-2002-231,906 and JP-A-2003-7,854). The self alignment contact structure (hereinafter abbreviated as SAC) is a structure, in which circumferences of the bit line 6 are covered with an insulating film such as nitride film or the like to provide an inhibition to the short circuit between the bit line 6 and the capacitance contact 4.

In the manufacture of the semiconductor device having the SAC structure, contact holes are formed in a self-alignment manner by employing an etch mask pattern having a size that is larger than the actual size of the contact hole, and by employing the side wall 17 of the silicon nitride film as an etch stop, which is provided on the side surface of the bit line 6. Having such configuration, the short circuit between the bit line 6 and the capacitance contact 4 can be inhibited when the capacitance contact 4 is misaligned.

Next, a method for manufacturing a semiconductor device having the SAC structure will be described below in reference to FIG. 21 to FIG. 27.

First of all, as shown in FIG. 21, shallow grooves are formed on a silicon substrate 10, similarly as in the typical manufacturing process for DRAM, and the grooves are filled with an insulating material to form element isolation insulating films 3, so that the memory cell region is sectioned into individual cell regions. Then, an impurity is diffused into the silicon substrate 10 to form source drain regions 2, thereby forming a MOS transistor, which will be transistors for the memory cells.

Next, cobalt silicide layers 12 are formed by silicidating the entire surfaces of the diffusion layers and the gates of respective transistors with cobalt. Thereafter, silicon nitride films 1 are formed on the surface of the silicon substrate 10 including the surface of element isolation insulating films 3 to coat the respective transistors.

Next, cell contact interlayer films 8 are formed by using a material such as silicon oxide film or the like so as to cover the respective transistors for memory cells in the memory cell region. Then, contact holes for coupling the bit line and the capacitance element to the transistors for memory cells in the cell contact interlayer films 8 are formed via a selective etch process. Then, tungsten (W) is deposited on the entire surfaces thereof via a chemical vapor deposition (CVD) until the contact holes are filled therewith. Thereafter, the surfaces of the cell contact interlayer films 8 are planarized via a chemical mechanical polishing (CMP) so as to leave W only in respective contact holes, thereby forming cell contacts 9. A cross sectional view of the semiconductor device after the steps so far is finished is shown in FIG. 21.

Next, as shown in FIG. 22, a bit contact interlayer film 13 comprising silicon oxide is formed to a predetermined thickness on the surfaces of the cell contact interlayer films 8 that include exposed surfaces of the cell contact 9 to coat the surfaces of the cell contacts 9. Then, the bit contact interlayer film 13 is etched so that only the positions directly above the portions electrically coupled to the bit lines 6 are selectively etched among the cell contacts 9 to form contact holes, thereby exposing the upper surface of the cell contacts 9. Then, W is deposited via CVD until the formed contact holes are filled therewith, similarly as in the formation process of the cell contacts 9, and the surfaces thereof are planarized via CMP so as to leave W only in respective contact holes, thereby forming bit contacts 14 for coupling to the bit lines 6. A cross sectional view of the semiconductor device after the steps so far is finished is shown in FIG. 22.

Next, as shown in FIG. 23, titanium nitride (TiN) for forming barrier metal layers 5 and tungsten (W) for forming bit lines 6 are deposited on the surfaces of the bit contact interlayer film 13, and multi-layered films comprising a silicon oxide film and a silicon nitride film are formed thereon as hard mask films 15. Then, the hard mask films 15, bit lines 6 and barrier metal layers 5 are patterned to form a bit-line pattern by employing a photo resist (not shown.) A cross sectional view of the semiconductor device after the steps so far is finished is shown in FIG. 23.

Next, as shown in FIG. 24, s silicon nitride film 16 is grown to a predetermined thickness on the entire surfaces to cover the hard mask films 15 and the bit lines 6.

Next, as shown in FIG. 25, the silicon nitride film 16 is etched back by conducting an anisotropic etch process so as to leave the silicon nitride film only on the side surfaces of the bit lines 6 and the barrier metal layers 5, thereby forming side walls 17.

Next, as shown in FIG. 26, silicon oxide films are formed to cover the bit lines 6, thereby forming capacitance contact interlayer films 7. Then, the capacitance contact interlayer films 7 are etched so that only the positions directly above the portions electrically coupled to capacitance elements 11 are selectively etched among the cell contacts 9 to form contact holes.

In this configuration, even if misalignments of the contact holes occur in the formation process thereof to cause the contact holes overlapping with the bit lines 6, unwanted etch of the side walls 17 is avoided, because the side walls 17 formed on the side surfaces of the bit lines 6 comprise the silicon nitride film, the etch ratio of which to the silicon oxide film contained in the capacitance contact interlayer film 7 is much higher. The exposure of the bit lines 6 in the contact hole is also avoided because the formed contact holes are self-aligned.

Then, similarly as in the formation process for the cell contacts 9 or the bit contacts 14, W is deposited via CVD until the contact holes are filled therewith, and the surfaces thereof are planarized via CMP so as to leave W only in respective contact holes, thereby forming capacitance contacts 4 for coupling to the capacitance elements 11. A cross sectional view of the semiconductor device after the steps so far is finished is shown in FIG. 26.

Then, the capacitance element 11 for coupling to the capacitance contact 4 is finally formed to complete the semiconductor device. A cross sectional view of the semiconductor device after the steps so far is finished is shown in FIG. 27.

The microscopic contact holes can be formed without causing a short-circuit to the bit line 6 by employing the SAC structure described above. However, when the SAC structure described above is employed, the manufacturing process additionally requires the process steps such as a step for forming hard mask film 15 on the bit line 6, a step for depositing a nitride film for forming the side wall 17, a step for etching back the side wall 17 or the like, thereby increasing the number of the processing steps in the manufacturing process.

The SAC structure is characterized in that nitride films are disposed on both of the upper part and the side wall part of an interconnect such as bit line 6 or the like, and therefore this configuration provides an advantageous effect of inhibiting the short circuit even if a misalignment occurs during the formation of the contact holes (capacitance contacts) between interconnects or even if a layout of intentionally disposing the contact holes in the region of upper part of the interconnect is employed.

In order to form such SAC structure, it is necessary to employ an etch condition including higher selective etch ratio of the oxide film of the capacitance contact interlayer film 7 to the nitride film existing in the upper part and the side walls of the interconnect such as bit line 6 or the like, when the contact hole for the capacitance contact 4 is processed. In addition, it is also necessary to employ the nitride film having better film quality. Since the deposition process at an elevated temperature is often required for depositing the nitride film having better film quality, the logic transistor having higher performance is often deteriorated. Consequently, when the memory cell regions and other types of circuits are formed on the same semiconductor substrate, such as a combined logic/DRAM device, it is difficult to obtain the nitride film having better film quality.

In addition, the SAC structure employs a hard mask of $SiO_2$/SiN films or SiN film instead of resist mask during the etch process for the interconnects such as the bit lines 5 or the like. This provides a thicker nitride film formed on the upper part of the interconnect, thereby providing higher height of the interconnects such as bit lines 5 or the like. As such, a higher aspect ratio of a line and space (L/S) portion of the interconnect (bit line) is obtainable in the process for forming the nitride film after etching the interconnects (process for forming the side walls 17 of the interconnects) and in the process for forming the capacitance contact interlayer film 7 after forming the side wall 17, and thus it is difficult to sufficiently achieve the better filling process.

Further, thicker nitride films for forming the side walls 17 are necessary to be formed, in order to leave thicker nitride films on the side wall portions of the interconnect such as the bit line 6 or the like in the SAC structure. However, the progressing miniaturization of the device reduces the size of the L/S portion to cause a conjunction between the interconnects, such that it becomes difficult to form thicker interconnect.

In addition, thicker nitride film formed on the interconnect provide thicker contact interlayer film in the SAC process, and thus it is disadvantageous for the miniaturization. This is due to the difficulties in the ability to etch thereof or in the ability to fill the contacts (with barrier metal, W or the like), rather than the problem of the resistance of the resist. Larger thickness of the contact interlayer film provides higher contact resistance.

Since the conventional method for manufacturing the semiconductor device described above employs the SAC configuration, in which the hard mask film is provided on the upper portion of the interconnect such as bit line and the side wall comprising the nitride film is formed on the side surface thereof, there have been rooms for providing improvements on the following points:

(1) Additional process steps of: depositing a hard mask film on the bit line; depositing a nitride film to form side walls; etching back the side wall, or the like, are required, thereby increasing the number of the steps of the manufacturing process, (2) Since the material having higher selective etch ratio should be selected by employing the nitride film having better film quality, which requires the deposition process at an elevated temperature, it is difficult to apply the SAC structure to the combined logic/DRAM device comprising the transistor having higher performance, which tends to be deteriorated at an elevated temperature.

(3) Since the hard mask film should be formed on the bit line, the height of the bit line is necessarily higher, and the progressing miniaturization causes difficulties in the process for filling the spaces between bit lines with interlayer films or in the process for composing the nitride films on the side walls of the bit lines.

SUMMARY OF THE INVENTION

It is an object of the present invention to stably provide a semiconductor device having higher reliability.

In order to achieve an above-described object, there is provided a method for manufacturing a semiconductor device, which comprises a transistor formed on a semiconductor substrate and a capacitance element disposed on the transistor, the capacitance element being coupled to the transistor, comprising: forming a transistor on a semiconductor substrate; forming a first interlayer insulating film to cover the transistor; forming a plurality of first electroconducting plugs within the first interlayer insulating film, the first electroconducting plug being coupled to the transistor; forming a second interlayer insulating film on the first interlayer insulating film to cover the first electroconducting plug; forming a second electroconducting plug within the second interlayer insulating film, the second electroconducting plug being coupled to the first electroconducting plug; forming a bit line on the second interlayer insulating film, the bit line being coupled to the second electroconducting plug; etching a part covering the first electroconducting plug in the second interlayer insulating film off; forming a nitride film to cover a side surface and an upper surface of the bit line; forming a third interlayer insulating film to cover the nitride film; forming a third electroconducting plug within the third interlayer insulating film and the nitride film, the third electroconducting plug being coupled to a first electroconducting plug, which is not coupled to the second electroconducting plug; and forming a capacitance element on the third interlayer insulating film, the capacitance element being coupled to the third electroconducting plug.

Since the nitride film is formed to cover the upper and the side surfaces of the bit lines according to the present invention, the short circuit between the bit line and the capacitance contact can be inhibited without employing SAC process, so that the number of the manufacturing process steps is reduced and the miniaturization thereof is achieved. In addition, the configuration according to the present invention reduces the need for employing the nitride film having better film quality, and therefore the configuration can be applicable to the combined logic/DRAM device comprising the transistor having higher performance, which tends to be deteriorated at an elevated temperature.

Further, the method for manufacturing the semiconductor device according to the present invention may have another configuration, in which the bit line may be formed directly on the cell contact interlayer film without forming a bit contact interlayer film and a bit contact.

According to another aspect of the present invention, there is provided a method for manufacturing a semiconductor device, which comprises a transistor formed on a semiconductor substrate and a capacitance element disposed on the transistor, the capacitance element being coupled to the transistor, comprising: forming a transistor on a semiconductor substrate; forming a first interlayer insulating film to cover the transistor; forming a first electroconducting plug within the first interlayer insulating film, the first electroconducting plug being coupled to the transistor; forming a second interlayer insulating film on the first interlayer insulating film to cover the first electroconducting plug; forming a second electroconducting plug within the second interlayer insulating film, the second electroconducting plug being coupled to the first electroconducting plug; forming a barrier metal film on the second interlayer insulating film, the barrier metal film being coupled to the second electroconducting plug; forming a bit line on the barrier metal film; selectively etching the barrier metal film to form an inversely-tapered shape; forming a third interlayer insulating film on the second interlayer insulating film to cover the bit line; forming a third electroconducting plug within the third interlayer insulating film and the second interlayer insulating film, the third electroconducting plug being coupled to a first electroconducting plug, which is not coupled to the second electroconducting plug; and forming a capacitance element on the third interlayer insulating film, the capacitance element being coupled to the third electroconducting plug.

According to the above-described aspect of the present invention, wider spacings between the bit line and the cell contact and/or between the bit line and the capacitance contact can be provided by having a configuration including selectively etching the barrier metal film of the bit line to form an inversely-tapered shape, and thus the short circuits between the bit line and the cell contact and/or between the bit line and the capacitance contact can be inhibited.

Further, the method for manufacturing the semiconductor device according to the present invention may have another configuration, in which the barrier metal layer formed on a lower surface of the bit line is selectively etched to form an inversely-tapered shape without forming the bit contact interlayer film and the bit contact, when a type of the semiconductor device comprising a bit line directly formed on the cell contact interlayer film is manufactured.

Since wider spacing between the bit line and the cell contact can be presented by having a configuration including forming the barrier metal film of the bit line to an inversely-tapered shape according to the above-described aspect of the present invention, this configuration reduces the need for having a larger room for the spacing for preventing the short circuit between the bit line and the cell contact by comprising a bit contact interlayer film. Therefore, the process steps for forming the bit contact interlayer film and the bit contact can be reduced, and the bit contact resistance can be reduced.

According to the present invention, a semiconductor device having higher reliability is stably provided.

DESCRIPTION OF THE PREFERRED EMBODIMENT

Embodiments of the present invention will be described in detail below by referring with the annexed figures.

First Embodiment

Figure 1:
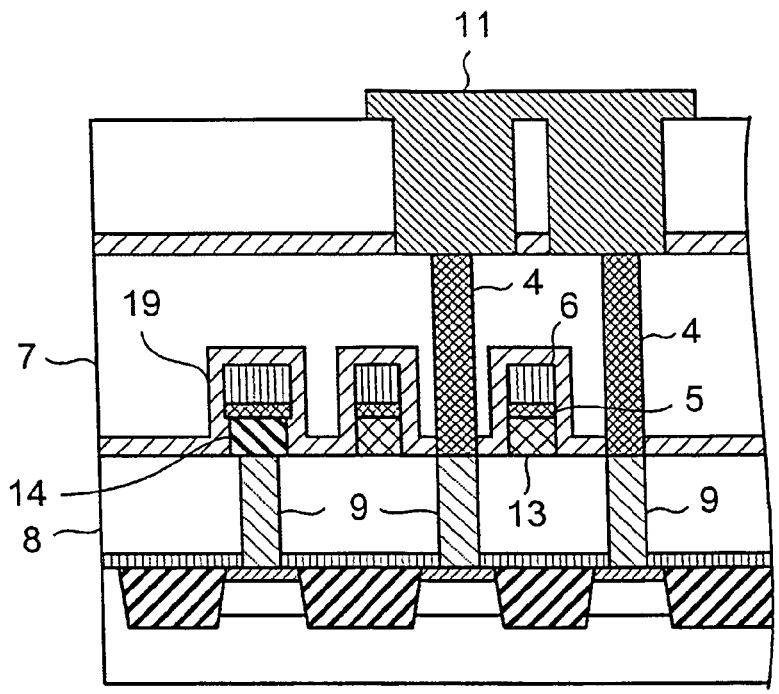
FIG. 1 is a cross sectional view of a semiconductor device manufactured according to a method for manufacturing a semiconductor device of the first embodiment of the present invention.
Figure 20:
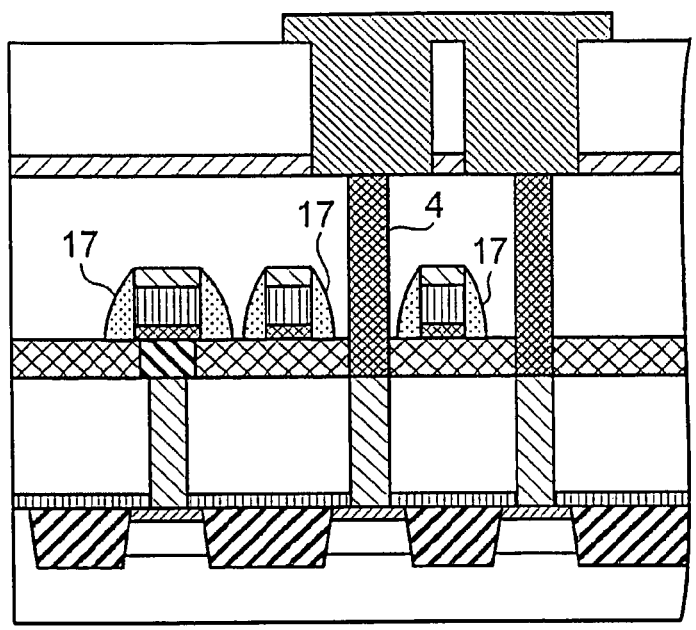
FIG. 20 is a cross sectional view of a conventional semiconductor device having the SAC structure.
Figure 21:
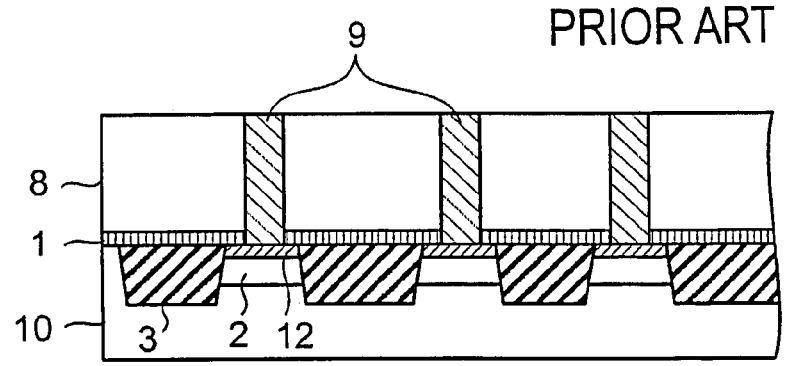
FIG. 21 is a cross sectional view of a conventional semiconductor device, for describing the method for manufacturing the semiconductor device of SAC structure.
Figure 22:
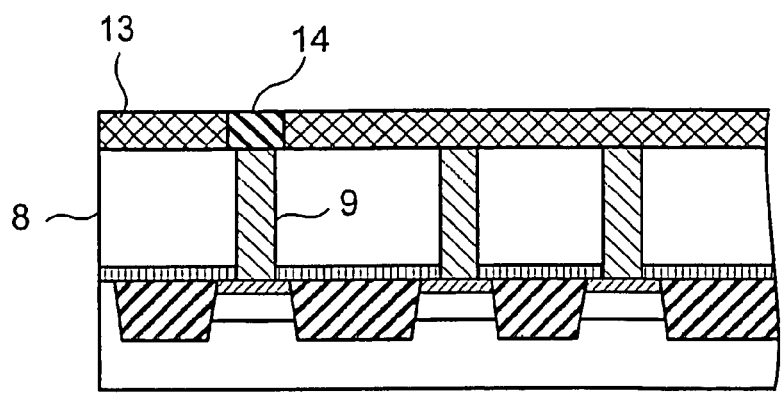
FIG. 22 is a cross sectional view of a conventional semiconductor device, for describing the method for manufacturing the semiconductor device of SAC structure.
Figure 23:
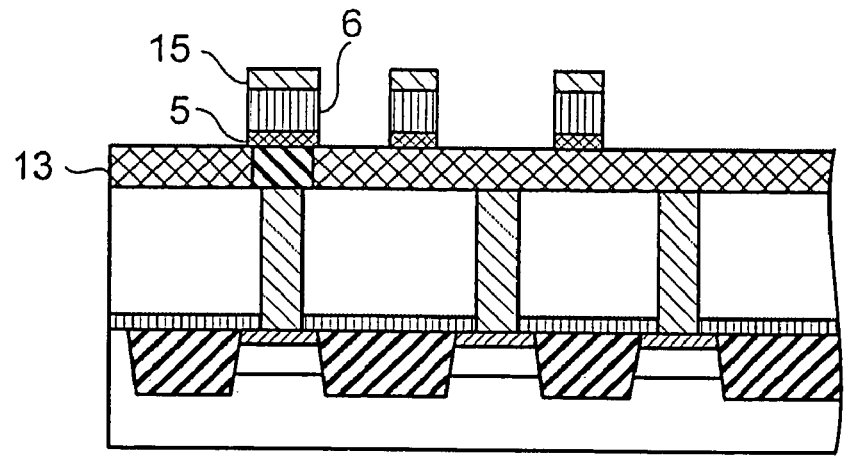
FIG. 23 is a cross sectional view of a conventional semiconductor device, for describing the method for manufacturing the semiconductor device of SAC structure.
Figure 24:
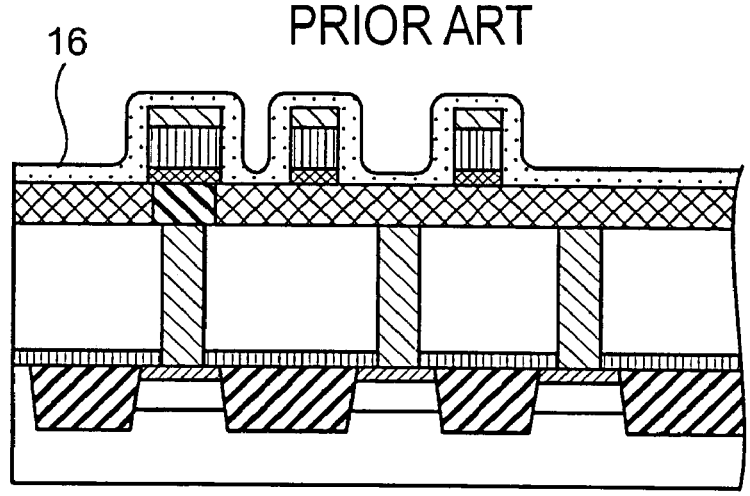
FIG. 24 is a cross sectional view of a conventional semiconductor device, for describing the method for manufacturing the semiconductor device of SAC structure.
Figure 25:
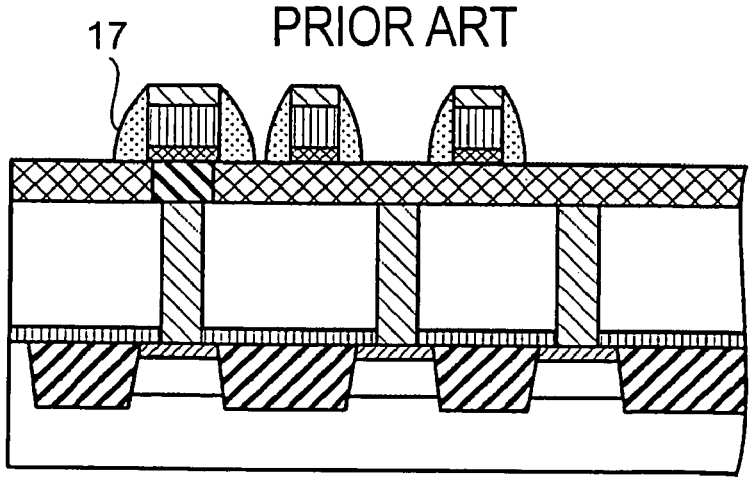
FIG. 25 is a cross sectional view of a conventional semiconductor device, for describing the method for manufacturing the semiconductor device of SAC structure.
Figure 26:
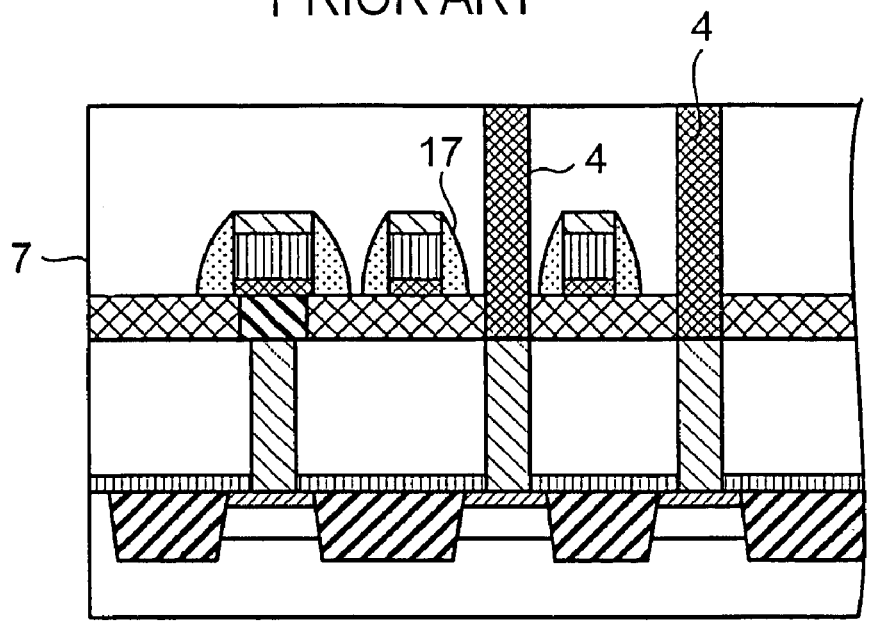
FIG. 26 is a cross sectional view of a conventional semiconductor device, for describing the method for manufacturing the semiconductor device of SAC structure.
Figure 27:
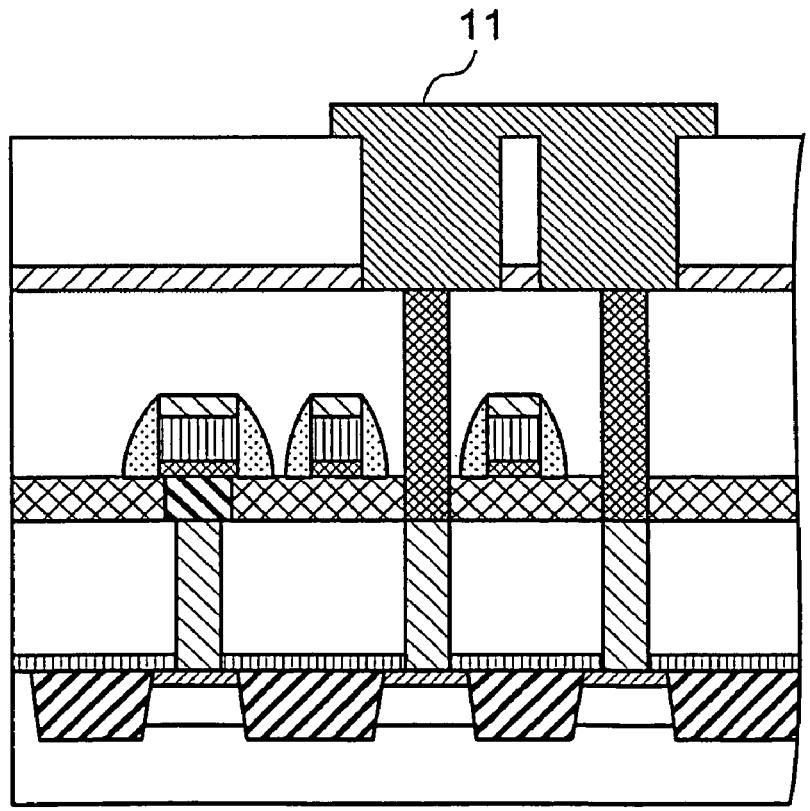
FIG. 27 is a cross sectional view of a conventional semiconductor device, for describing the method for manufacturing the semiconductor device of SAC structure.

FIG. 1 is a cross sectional view of a semiconductor device manufactured by a method for manufacturing a semiconductor device according to a first embodiment of the present invention. In FIG. 1, the same numerals are assigned to the same components, which are also shown in FIG. 20, and thus the specific descriptions thereof are not presented.

A semiconductor device in this embodiment is, as shown in FIG. 1, a semiconductor device manufactured by the process, in which the bit contact interlayer film 13 of the conventional semiconductor device which does not have the SAC structure is etched off except the portion where bit line 6 is formed, and then direct nitride film 19 is formed on the entire surface of the top surface and the side surface of the bit line 6 so as to cover the bit line 6 in a same processing step.

Here, the direct nitride film 19 means a nitride film as deposited, which is directly deposited on the bit line 6 without being processed for proceeding to the next process step via any processing steps for the deposited nitride film such as etch back process or the like. In other words, the direct nitride film is a term for distinguishing from the nitride film formed on the side wall in the SAC structure, and the formation method thereof, material thereof or the like are the same as that for the typical nitride film.

Next, the method for manufacturing a semiconductor device of this embodiment will be described with referring to FIG. 2 to FIG. 8.

Figure 2:
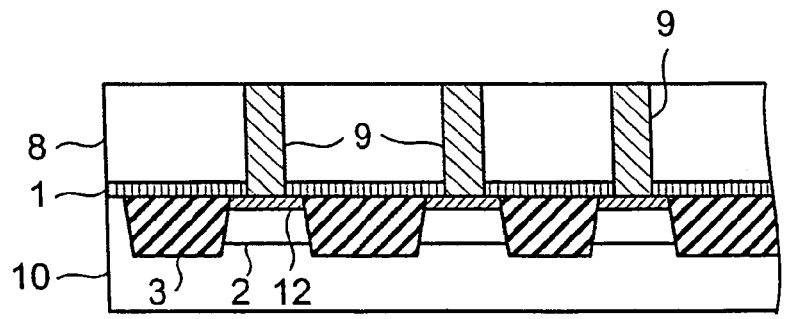
FIG. 2 is a cross sectional view of a semiconductor device for describing the method for manufacturing a semiconductor device of the first embodiment of the present invention.
Figure 3:
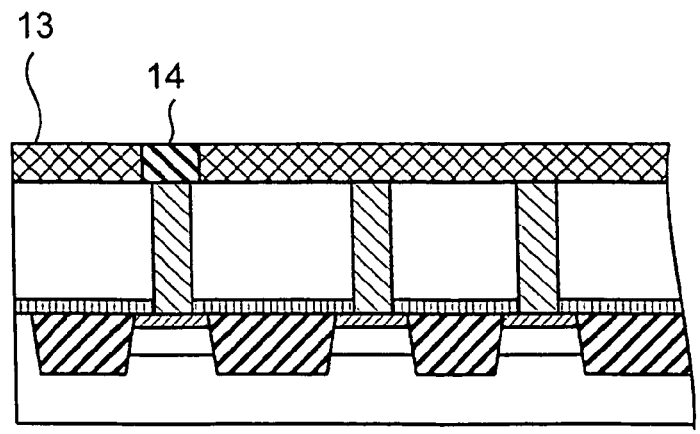
FIG. 3 is a cross sectional view of a semiconductor device for describing the method for manufacturing a semiconductor device of the first embodiment of the present invention.

First of all, as shown in FIG. 2, a transistor for memory cell is formed on the silicon substrate 10 by a method similar to the conventional method, and a cell contact interlayer film 8, and a cell contact 9 are further formed. Then, as shown in FIG. 3, a cell contact interlayer film 13 and a bit contact 14 are formed by a method similar to the conventional method.

Figure 4:
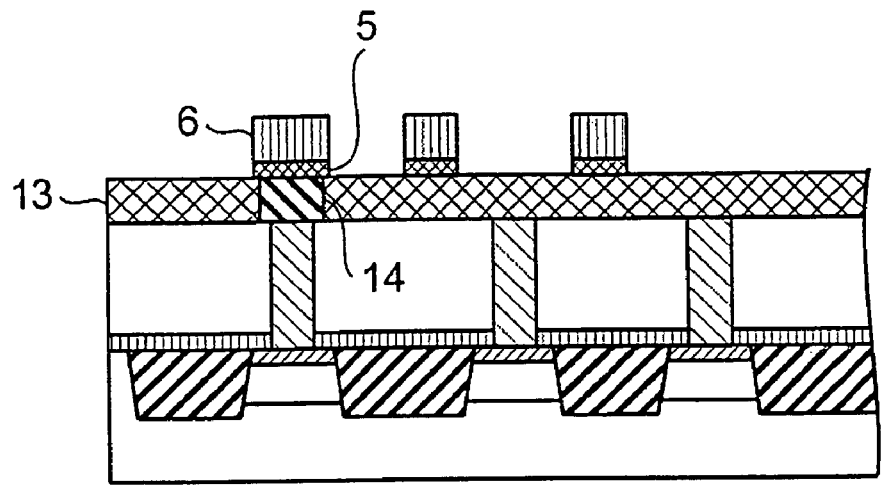
FIG. 4 is a cross sectional view of a semiconductor device for describing the method for manufacturing a semiconductor device of the first embodiment of the present invention.

Next, as shown in FIG. 4, titanium nitride (TiN) for forming barrier metal layers 5 and tungsten (W) for forming bit lines 6 are formed on the surface of the bit contact interlayer film 13. Then, the bit lines 6 and the barrier metal layers 5 are patterned to bit line-shape by using a photo resist (not shown.) A cross sectional view of the semiconductor device after the steps so far is finished is shown in FIG. 3. It should be noted that no hard mask is formed on the upper surface of the bit lines 6.

Figure 5:
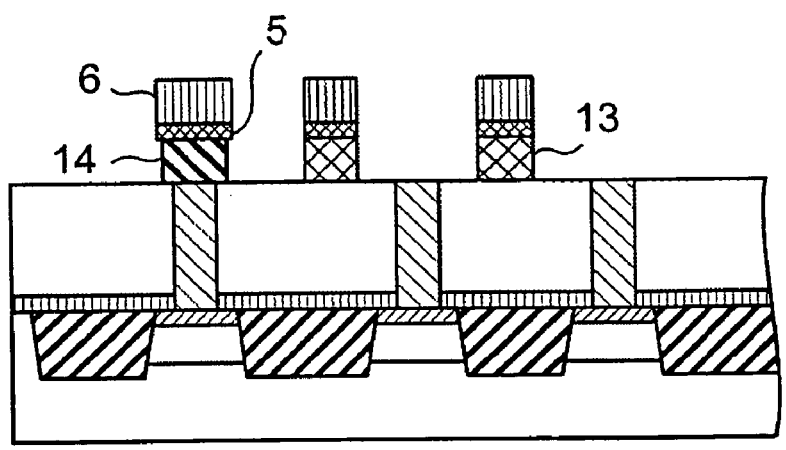
FIG. 5 is a cross sectional view of a semiconductor device for describing the method for manufacturing a semiconductor device of the first embodiment of the present invention.

Next, as shown in FIG. 5, the bit contact interlayer film 13 is partially etched off to create a portion, on which a capacitance contact 4 for electrically coupling a capacitance element 11 formed in the upper layer thereof to a cell contact 9 will be deposited. However, in this embodiment, the entire bit contact interlayer film 13 is etched off except the region where the bit line 6 is formed thereon.

Nevertheless, it is not necessary to etch off the entire bit contact interlayer film 13 except the region where the bit line 6 is formed thereon, and it is sufficient to etch at least only the region of the bit contact interlayer film 13 covering the upper end of the cell contact 9. This is because the region covering the upper end of the cell contact 9 of the bit contact interlayer film 13 (portion directly above the cell contact 9) corresponds to the portion, on which the capacitance contact 4 for electrically coupling the capacitance element 11 formed on the upper layer thereof and the cell contact 9 will be formed.

However, the entire bit contact interlayer film 13 can be etched off except the region where the bit line 6 is formed thereon through the bit line 6 and the barrier metal layer 5 as masks, in order to simplify the manufacturing process.

Here, the reason for having a configuration of partially etching off to create the portion of the bit contact interlayer film 13, on which a capacitance contact 4 for electrically coupling a capacitance element 11 formed in the upper layer thereof to a cell contact 9 will be formed before forming the direct nitride film 19 is described as follows. If the portion of the bit contact interlayer film 13 for forming the capacitance contact 4 is not created before forming the direct nitride film 19, it will be necessary to conduct an etching of triple-layer structure ($SiO_2/SiN/SiO_2$) comprising a capacitance contact interlayer film 7, the direct nitride film 19 and the bit contact interlayer film 13 during the step for forming the capacitance contact 4 in the later process. However, when the triple-layer structure ($SiO_2/SiN/SiO_2$) is etched, the direct nitride film 19, which comprises an SiN film, is also etched to some level during the step for etching the bit contact interlayer film 13 that includes an $SiO_2$ film, thereby easily causing the short circuit between the capacitance contact 4 and the bit line 6.

Further, in such case, the capacitance contact interlayer film 7 that is $SiO_2$ film as the first level of the triple-layer structure is also etched to increase the hole diameter, thereby easily causing the short circuit between the capacitance contact 4 and the bit line 6.

On the contrary, when the portion of the bit contact interlayer film 13 for forming the capacitance contact 4 is removed before forming the direct nitride film 19, only an etch of the dual layer structure composing of the capacitance contact interlayer film 7 and the direct nitride film 19 ($SiN/SiO_2$) is sufficient when the capacitance contact 4 is formed. In this case, the capacitance contact interlayer film 7 substantially composed of an $SiO_2$ film, and the direct nitride film 19 substantially composed of an SiN film are etched in respective etch steps. In these etch steps, etching processes of highly selective $SiN/SiO_2$ etch ratio are conducted. In summary, since no etching step is included after the etching of the direct nitride film 19, the possible reasons for reducing the spacing between the capacitance contact 4 and the bit line 6 and/or for causing the short-circuit between the capacitance contact 4 and the bit line 6 are omitted.

Figure 6:
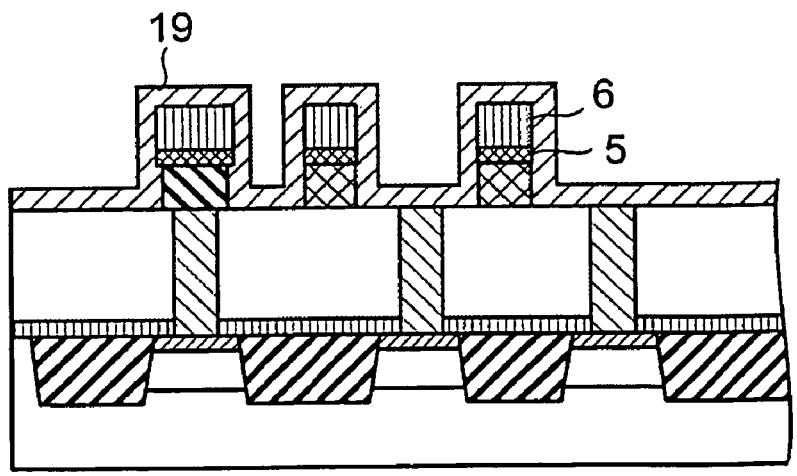
FIG. 6 is a cross sectional view of a semiconductor device for describing the method for manufacturing a semiconductor device of the first embodiment of the present invention.

Next, as shown in FIG. 6, the direct nitride film 19 consisting substantially of SiN is formed to cover the upper and side surfaces the bit line.

Although the present embodiment is described by illustrating the case of employing SiN for the direct nitride film 19, it should be understood that the present invention is not limited to such specific illustration, and other nitride film such as SiCN, SiON, SiC or the like may be used for the direct nitride film 19.

In addition, the method employed for forming the direct nitride film 19 may be a method for forming any of: a plasma-related CVD film; a sub-atmospheric CVD (SA-CVD) film; or an atomic layer deposition (ALD) film.

Figure 7:
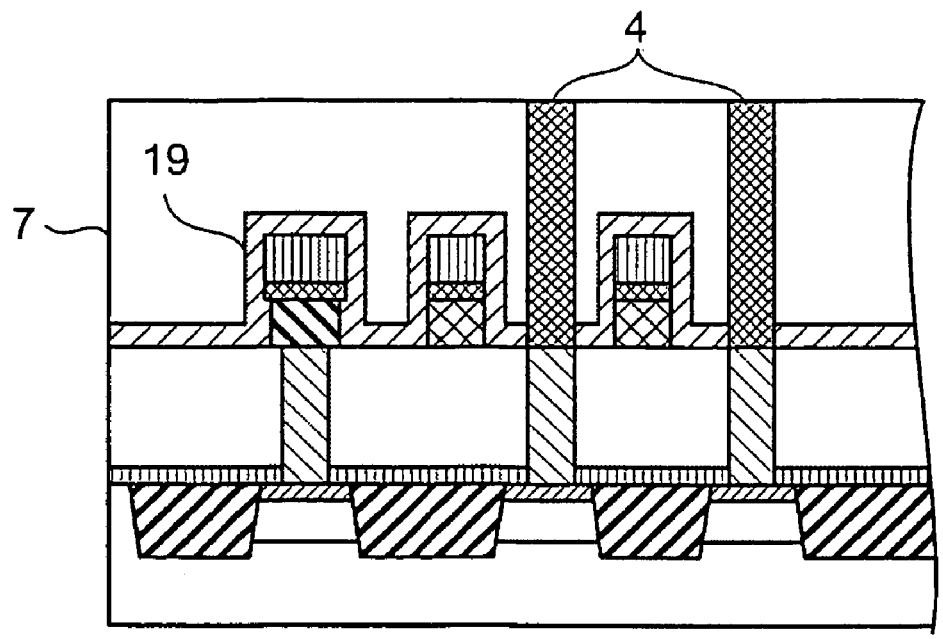
FIG. 7 is a cross sectional view of a semiconductor device for describing the method for manufacturing a semiconductor device of the first embodiment of the present invention.
Figure 8:
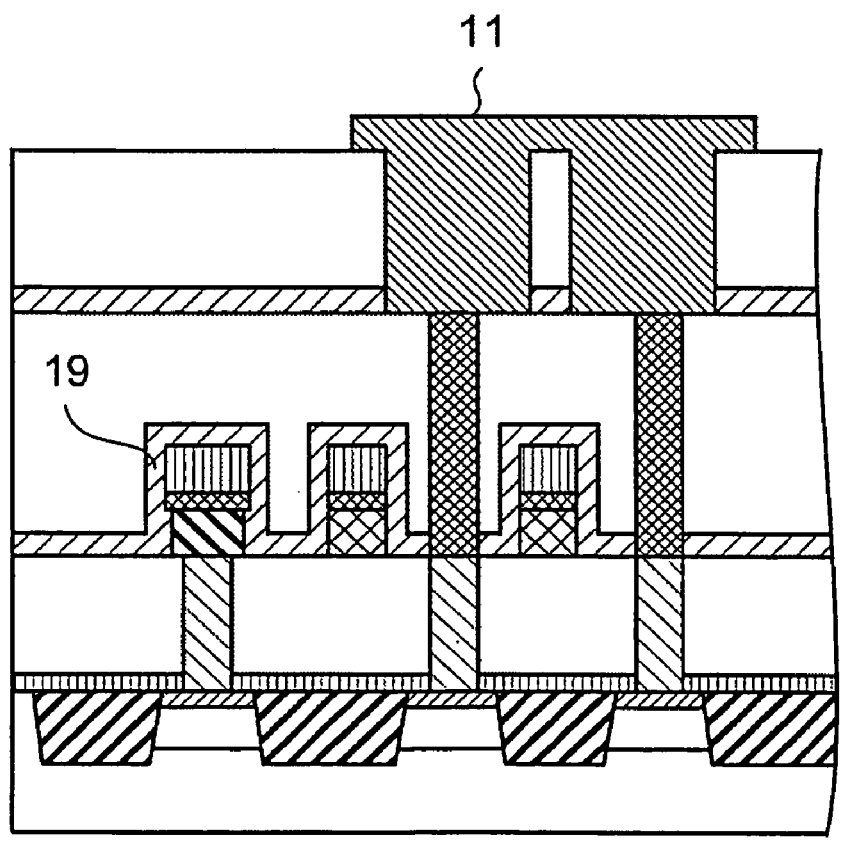
FIG. 8 is a cross sectional view of a semiconductor device for describing the method for manufacturing a semiconductor device of the first embodiment of the present invention.

Then, after forming the direct nitride film 19, the capacitance contact interlayer film 7 is formed similarly as in a conventional as shown in FIG. 7, and then the capacitance contact interlayer film 7 is partially etched to create the portion where the capacitance contact 4 is deposited. In such case, since the etching once stops at the direct nitride film 19, an over etch, in which the etch proceeds toward the lateral direction, can be suitably controlled, and thus the short-circuiting between the capacitance contact 4 formed on this portion and the bit line 6 can be inhibited. Then, the direct nitride film 19 underlying the etched portion of the capacitance contact layer is removed, and thereafter the capacitance contact 4 is formed thereon. Finally, as shown in FIG. 8, a capacitance element 11 is formed similarly as in the conventional method, and the semiconductor device of this embodiment is eventually completed.

Since the method for manufacturing the semiconductor device of this embodiment employs a configuration, in which the bit line 6 is covered by the direct nitride film 19 without employing the SAC process, the film thickness of the nitride film of the upper part of the bit line 6 is almost the same as the film thickness of side wall thereof. Therefore, the height of the bit line 6 itself can be reduced, and consequently, an aspect ratio of the L/S portion between the bit lines 6 can be reduced in the case of forming the capacitance contact interlayer film 7 after forming the bit line 6. Therefore, the situation where the capacitance contact interlayer film 7 cannot be formed between the bit lines 6 is scarcely occurred, and thus a further miniaturization becomes possible.

In addition, the SAC process include forming the side walls by forming the nitride films between the bit lines 6 and thereafter etching back the formed nitride film, so that the nitride films of side walls of bit lines 6 become thinner during the etch back process. Further, excessively thicker nitride film presents a situation where bit lines are mutually joined together. Therefore, when a miniaturization progresses to a certain level, it becomes difficult for the SAC process to form the side wall having a thickness greater than the predetermined thickness.

On the contrary, the present embodiment includes forming the direct nitride film so as to cover the bit line and does not include any further processing steps for the deposited nitride film such as etch back process. Thus the film thickness thereof is not reduced because the manufacturing process is free of the etch back process. Since the present embodiment provides forming nitride film having a predetermined film thickness on the side wall of the interconnect, unlike the SAC structure, the present invention is advantageous in the recent situation where a miniaturization are progressing.

Further, in the SAC process, there is higher necessity for involving higher selective etch ratio of the oxide film of the capacitance contact interlayer film 7 to the nitride film existing in the upper part and the side walls of the bit line 6, when the contact hole for the capacitance contact 4 is processed, and there is higher necessity for employing the nitride film having better film quality. However, since the necessity for involving higher selective etch ratio of the oxide film to the nitride film is quite low according to the method for manufacturing a semiconductor device of this embodiment, the necessity for depositing the nitride film having better film quality, which is required to be deposited at an elevated temperature, is also reduced. Therefore, the necessity for raising the deposition temperature for the direct nitride film 19 to an elevated temperature is reduced, and thus the configuration can be applicable to the combined logic/DRAM device comprising the transistor having higher performances.

Further, since the direct nitride film process in the method for manufacturing the semiconductor device of this embodiment is free of forming a hard mask film on the bit line 6, the height of the bit line 6 is designed to be lower. Therefore, the aspect ratio thereof can be small, and thus the filling thereof during the deposition of the direct nitride film 19 and/or the deposition of the capacitance contact interlayer film 7 can be promoted.

In addition, since thicker nitride film formed on the bit line provide thicker contact interlayer film in the SAC process, the thickness of the contact interlayer film becomes thicker, thereby providing higher contact resistance. On the contrary, the height of the bit line 6 can be designed to be lower by employing the method for manufacturing the semiconductor device according to the present embodiment by the reason stated above, thereby inhibiting the increase of the contact resistance.

Here, thicker nitride film is formed on the upper part of bit line 6 in the SAC process, and thus a layout of intentionally disposing the contact holes in the region of upper part of the bit lines 6 can be applied. On the contrary, it is difficult to employ a layout of intentionally disposing the contact holes in the region of upper part of the bit lines 6 according to the present embodiment, because the thickness of nitride film on the side wall of the bit line 6 is same as that on the upper surface, when the whole of the bit line 6 is covered with the direct nitride film 19, as described in this embodiment. In addition, if a layout of forming the contact hole between the bit line 6 and the bit line 6 is employed, it can hardly be occurred that the contact hole is formed in the upper portion of the bit line 6 by a misalignment.

That is, according to the present embodiment, advantageous effects described below can be obtained.

When the capacitance contact interlayer film is partially etched to create the portion where the capacitance contact is deposited, after the upper surface and the side surface of bit line and the upper part of the cell contact interlayer film are covered with the nitride film, the etch can be once stopped at the nitride film, and therefore the lateral progress of the etch can be controlled. Thus, the short circuit between the bit line and the capacitance contact can be inhibited without employing the SAC process. As a result, the number of the steps of the manufacturing process can be reduced and a miniaturization can be achieved. Further, since the necessity for employing the nitride film having better film quality is reduced, the configuration of the present embodiment is applicable to the combined logic/DRAM device comprising the transistor having higher performance, which tends to be deteriorated at an elevated temperature. Further, since the configuration includes covering the upper surfaces and the side surfaces of the bit lines with the nitride film, the insulating film is ensured to be formed between the bit line and the cell contact, thereby surely enabling the inhibition of the short circuit between the bit line and the cell contact.

Second Embodiment

Figure 9:
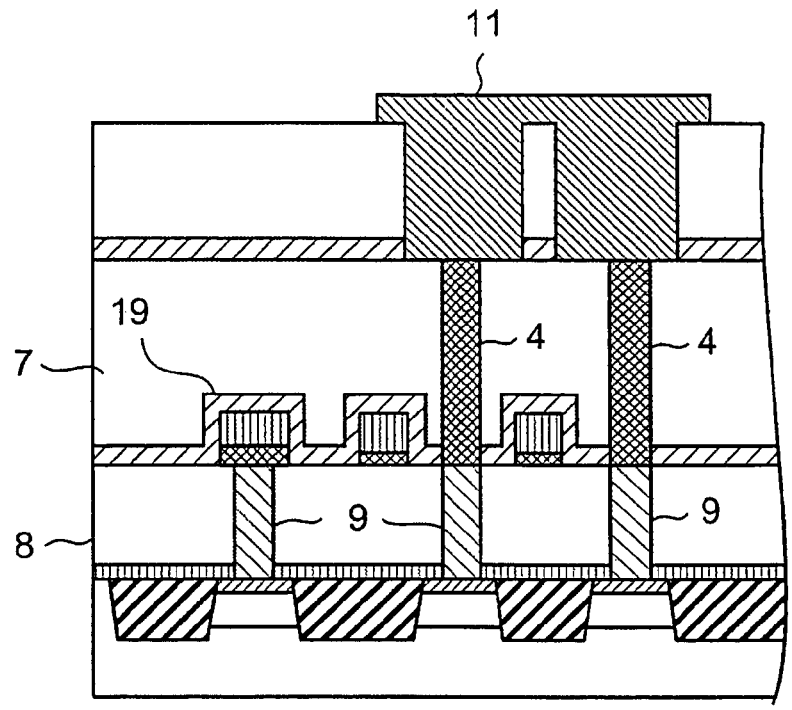
FIG. 9 is a cross sectional view of a semiconductor device manufactured according to a method for manufacturing a semiconductor device of the second embodiment of the present invention.

In the next, a method for manufacturing a semiconductor device of the second embodiment of the present invention will be described. A cross sectional view of a DRAM constituted by implementing the method for manufacturing the semiconductor device according to the present embodiment is shown in FIG. 9.

The semiconductor device according to the present embodiment typically represents a case where the feature of the present invention is applied to a DRAM having a constitution, in which a bit line 6 is formed directly on a cell contact interlayer film 8, without forming a bit contact interlayer film 13.

The present embodiment shows that the short circuit between the bit line 6 and the capacitance contact 4 can be inhibited by forming the bit line 6 directly on the cell contact interlayer film 8 without comprising a bit contact interlayer film 13.

The method for manufacturing the semiconductor device of the present embodiment will be described below, in reference to FIG. 10 to FIG. 14.

Figure 10:
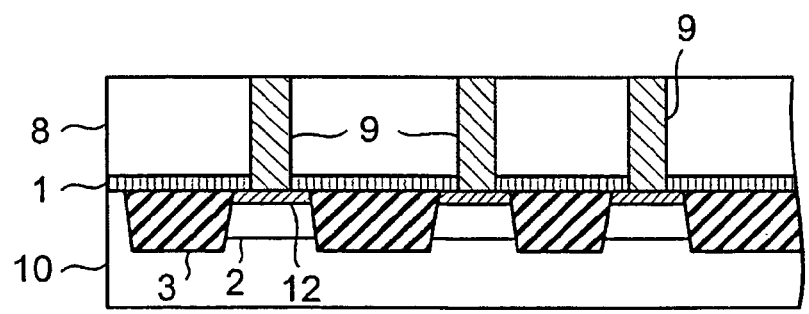
FIG. 10 is a cross sectional view of a semiconductor device for describing the method for manufacturing a semiconductor device of the second embodiment of the present invention.

First of all, as shown in FIG. 10, transistors for memory cells are formed on a silicon substrate 10 similarly as in the conventional method, and cell contact interlayer films 8 and cell contacts 9 are further formed.

Figure 11:
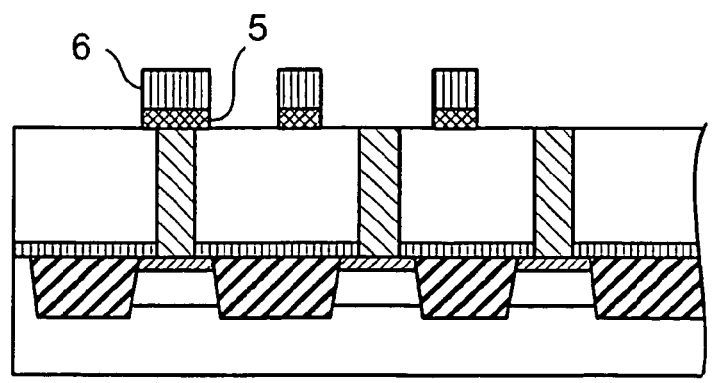
FIG. 11 is a cross sectional view of a semiconductor device for describing the method for manufacturing a semiconductor device of the second embodiment of the present invention.

Then, as shown in FIG. 11, titanium nitride (TiN) for forming barrier metal layers 5 and tungsten (W) for forming a bit line 6 are formed on the surface of the cell contact interlayer film 8. Then, the bit line 6 and the barrier metal layer 5 are patterned to a bit line shape by using a photo resist (not shown.) A cross sectional view of the semiconductor device after the steps so far is finished is shown in FIG. 11.

Figure 12:
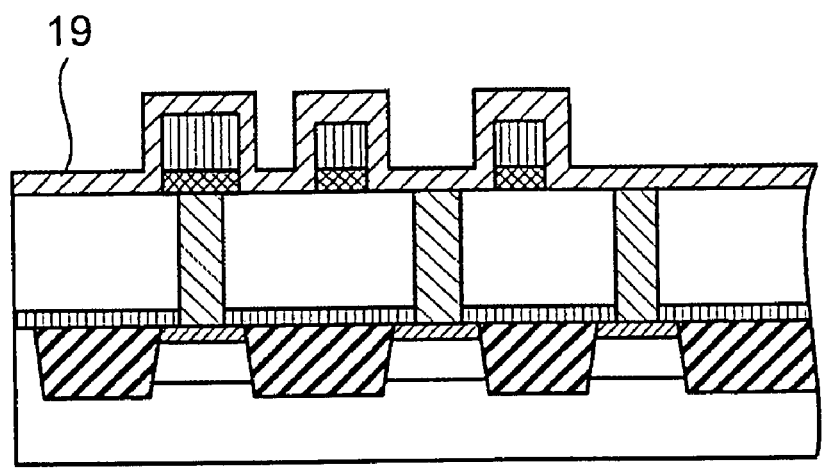
FIG. 12 is a cross sectional view of a semiconductor device for describing the method for manufacturing a semiconductor device of the second embodiment of the present invention.

Then, as shown in FIG. 12, a direct nitride film 19 consisting essentially of SiN is formed similarly as in the conventional method so as to cover the upper surface and the side surfaces of bit line 6.

The direct nitride film 19 is not limited to SiN in the present embodiment, and other nitride film such as SiON film, SiC film, SiCN film or the like can be used.

Figure 13:
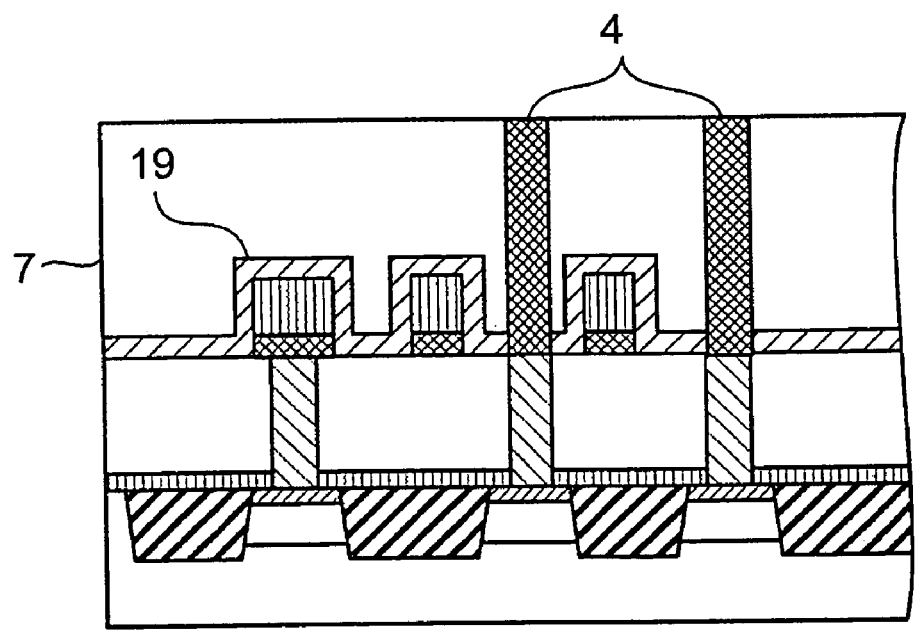
FIG. 13 is a cross sectional view of a semiconductor device for describing the method for manufacturing a semiconductor device of the second embodiment of the present invention.
Figure 14:
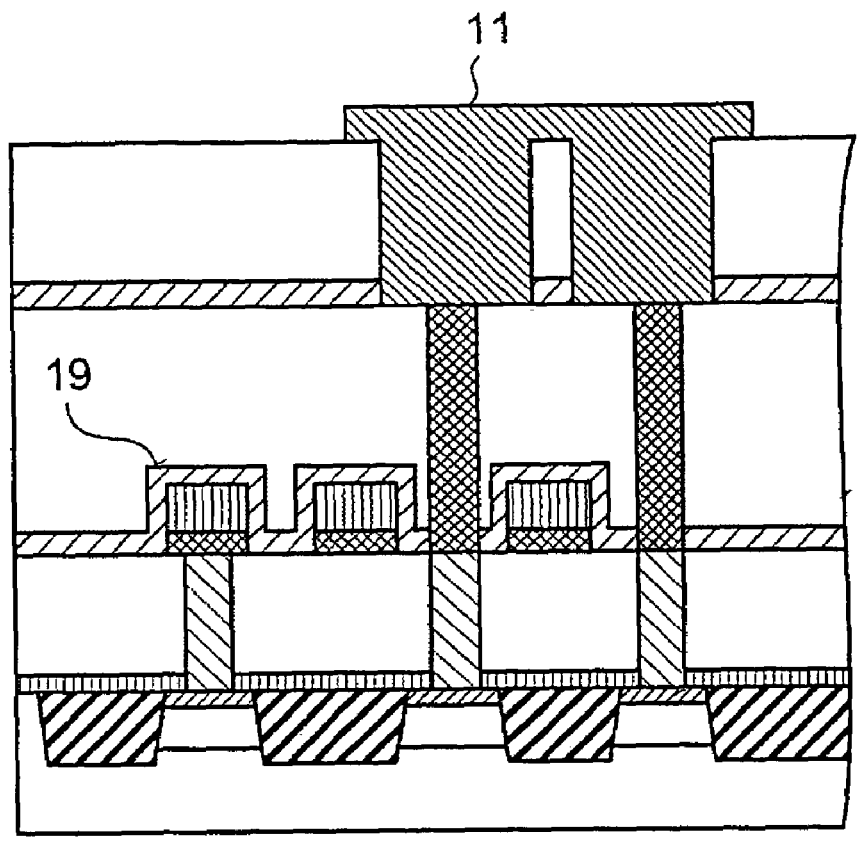
FIG. 14 is a cross sectional view of a semiconductor device for describing the method for manufacturing a semiconductor device of the second embodiment of the present invention.

After the direct nitride film 19 is formed, a capacitance contact interlayer film 7 and capacitance contacts 4 are formed similarly as in the conventional method, as shown in FIG. 13. Finally, a capacitance element 11 is formed similarly as in the conventional method as shown in FIG. 14, to complete the semiconductor device in the present embodiment.

It has been described in the above-described first and the second embodiment that the short circuit between the bit line 6 and the capacitance contact 4 can be prevented by employing the direct nitride film process. It is further possible to inhibit the short circuit between the bit line 6 and the cell contact 9 by employing the direct nitride film process, in addition to inhibiting the short circuit between the bit line 6 and the capacitance contact 4, by employing the direct nitride film process, in particular for the structure being free of the bit contact interlayer film 13. The reason is that the configuration having the nitride film existing between the cell contact 9 and the bit line 6 is superior to other configuration in preventing the short circuit therebetween.

More detailed description thereof may be that employing the direct nitride film process provides a configuration, in which a nitride film is disposed between the cell contact 9 and the bit line 6, instead of the capacitance contact interlayer film 7. Although typical interlayer insulating film such as capacitance contact interlayer film 7 generally comprises oxide film such as $SiO_2$, the nitride film is superior to the oxide film in providing the electric insulation, and the nitride film is also often superior to the oxide film in providing better coverage. Therefore, the anticipation of ensuring the formation of the insulating film between the bit line 6 and the cell contact 9 increases when direct nitride film process is employed.

Third Embodiment

In the next, a method for manufacturing a semiconductor device of the third embodiment of the present invention will be described.

Figure 15:
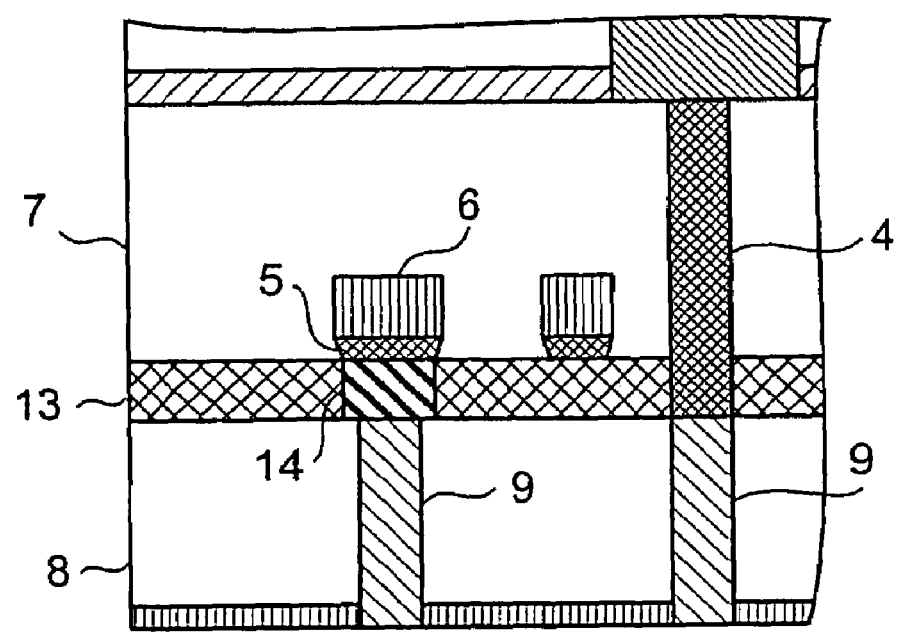
FIG. 15 is a cross sectional view of a semiconductor device typically illustrating a case where the method for manufacturing the semiconductor device of the third embodiment of the present invention is applied to a semiconductor device having a constitution, in which a bit contact interlayer film 13 is formed on a cell contact interlayer film 8.
Figure 16:
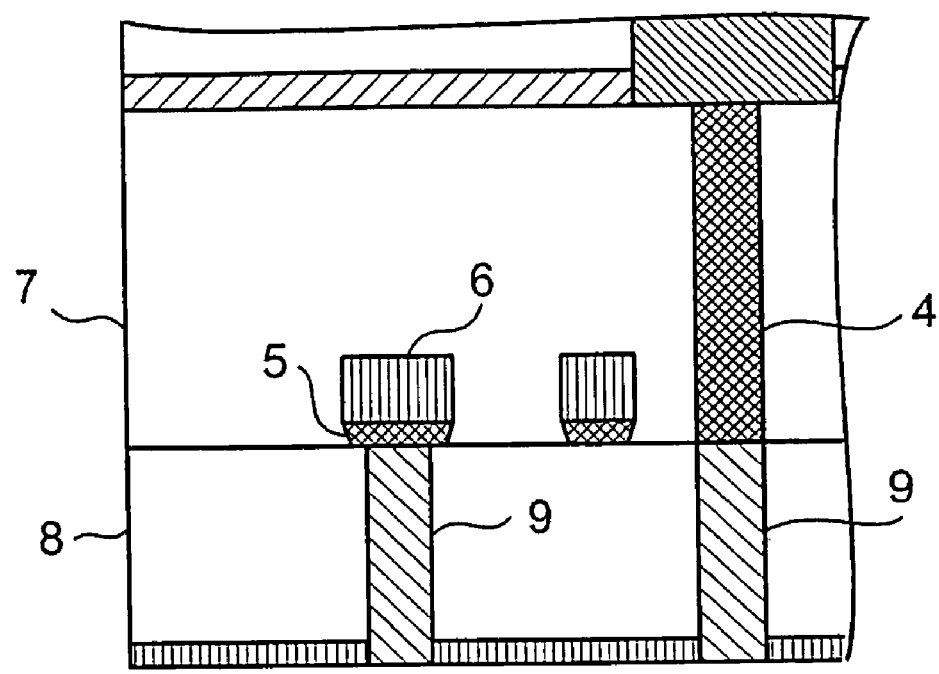
FIG. 16 is a cross sectional view of a semiconductor device typically illustrating a case where the method for manufacturing the semiconductor device of the third embodiment of the present invention is applied to a semiconductor device having a constitution, in which a bit contact interlayer film 13 is not formed on the cell contact interlayer film 8.

FIG. 15 and FIG. 16 are cross sectional views of a semiconductor device manufactured according to a method for manufacturing a semiconductor device of the third embodiment of the present invention. In FIG. 15 and FIG. 16, the same numerals are assigned to the same components that are also shown in FIG. 1, and thus the specific descriptions thereof are not presented.

FIG. 15 is a cross sectional view of a semiconductor device typically illustrating a case where the method for manufacturing the semiconductor device of the third embodiment of the present invention is applied to a semiconductor device having a constitution, in which a bit contact interlayer film 13 is formed on a cell contact interlayer film 8 and a bit line 6 is formed on the bit contact interlayer film 13. FIG. 16 is a cross sectional view of a semiconductor device typically illustrating a case where the method for manufacturing the semiconductor device of the third embodiment of the present invention is applied to a semiconductor device having a constitution, in which a bit line 6 is formed directly on a cell contact interlayer film 8, without forming a bit contact interlayer film 13 on the cell contact interlayer film 8.

In the method for manufacturing the semiconductor device of the present embodiment, a barrier metal layer 5 composed of titanium nitride is etched to form an inversely-tapered shape by using a gas of CF4 or the like which is capable of selectively etching only titanium nitride (TiN) during the formation of the bit line 6. Then, the barrier metal layer 5 is selectively etched, and thereafter a capacitance contact interlayer film 7 and a capacitance contact 4 or the like are formed similarly as in the conventional method.

Since wider spacings between the bit line 6 and the cell contact 9 and/or between the bit line 6 and the capacitance contact 4 can be presented by having a configuration including selectively etching the barrier metal film 5 of the bit line 6 to form an inversely-tapered shape according to the above-described aspect of the present invention, this configuration provides the inhibition of the short circuits between the bit line 6 and the cell contact 9 and/or between the bit line 6 and the capacitance contact 4.

Further, since wider spacing between the bit line 6 and the cell contact 9 can be presented by having a configuration including selectively etching the barrier metal film 5 to form an inversely-tapered shape according to the present embodiment, this configuration reduces, depending on the circumstances, the need for having a larger room for the spacing for preventing the short circuit between the bit line 6 and the cell contact 9 by comprising a bit contact interlayer film 13.

Having such configuration, the process steps for forming the bit contact interlayer film 13 and the bit contact 14 can be omitted, and the bit contact resistance can also be reduced.

The reason for providing larger room for the spacing for preventing the short circuit between the bit line 6 and the cell contact 9 or the capacitance contact 4 by etching the barrier metal film 5 to form an inversely-tapered shape will be described as follows in reference to FIGS. 17A to 17E. Here, the geometric aspects thereof are exaggerated in FIGS. 17A to 17E, for helping the readers to suitably understand the characteristics of the configuration shown in these figures.

In etching of the bit line 6 and the barrier metal layer 5, masks 18a and 18b are precedently the barrier metal layer formed on the bit line 6.

Figure 17A:
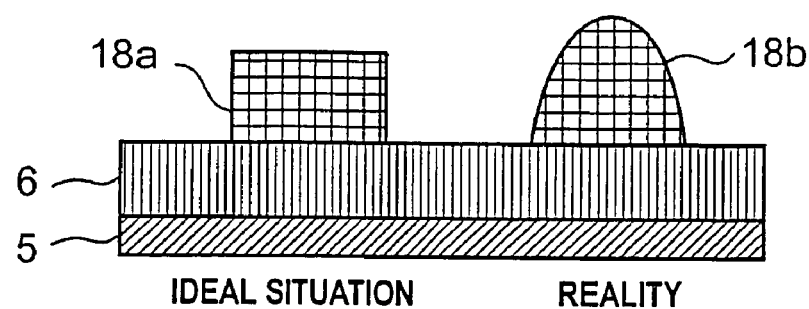
FIGS. 17A to 17E are cross sectional views of the multi-layer structure having photo resists thereon, for describing the reason for preventing the short circuit between the bit line 6 and either of the cell contact 9 and the capacitance contact 4 by etching the barrier metal layer 5 into an inversely-tapered shape.
Figure 17B:
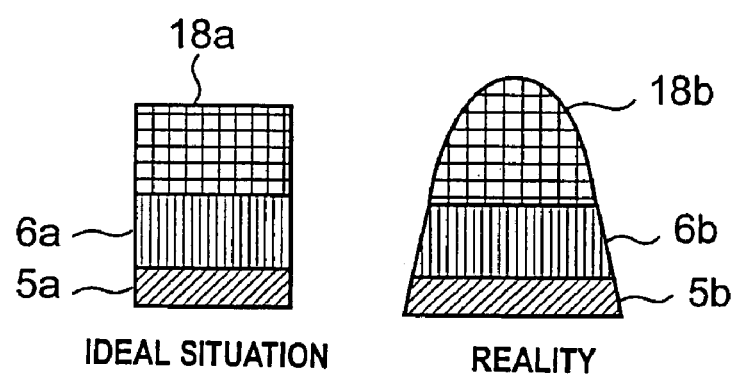
Figure 17C:
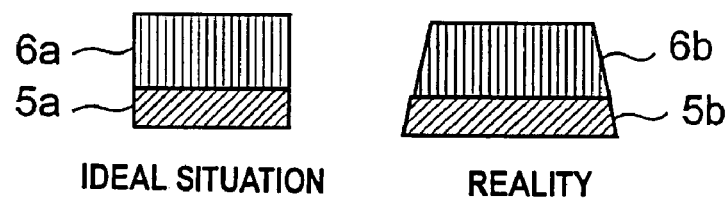
Figure 17D:
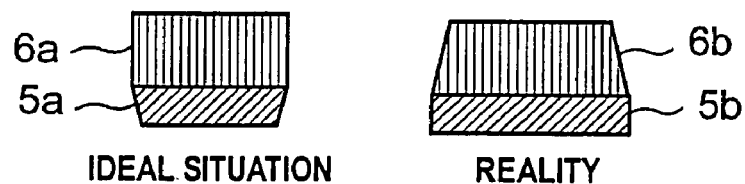
Figure 17E:
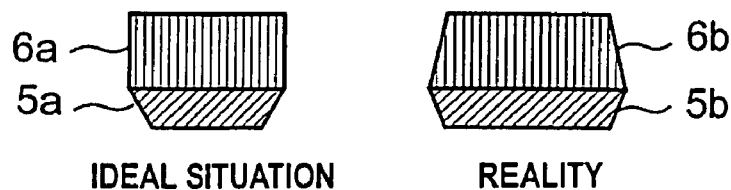
Figure 18:
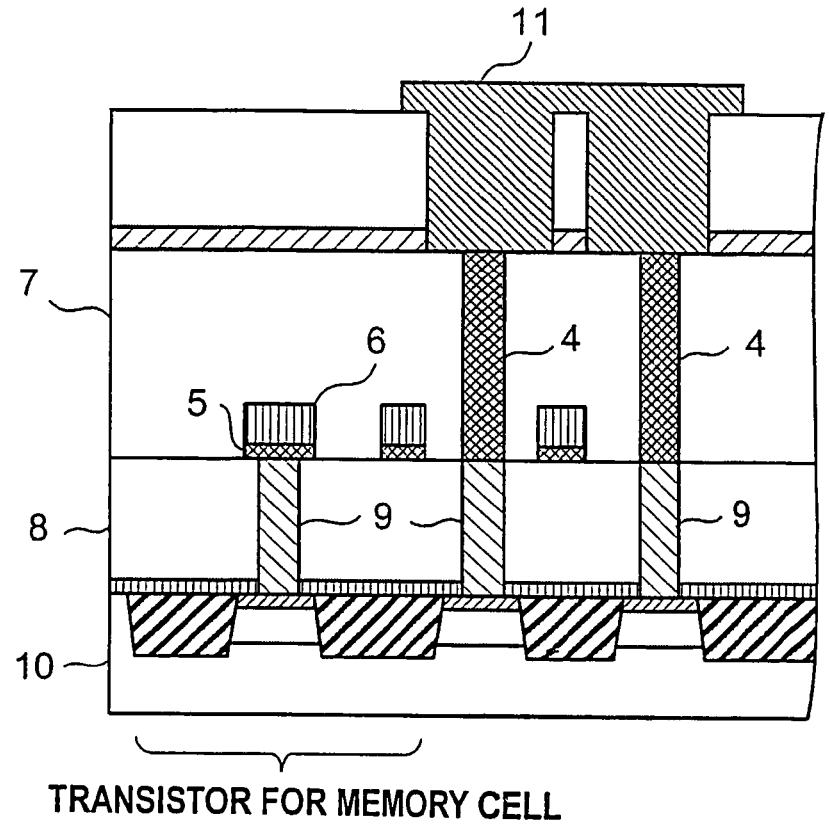
FIG. 18 is a cross sectional view of a conventional semiconductor device.
Figure 19:
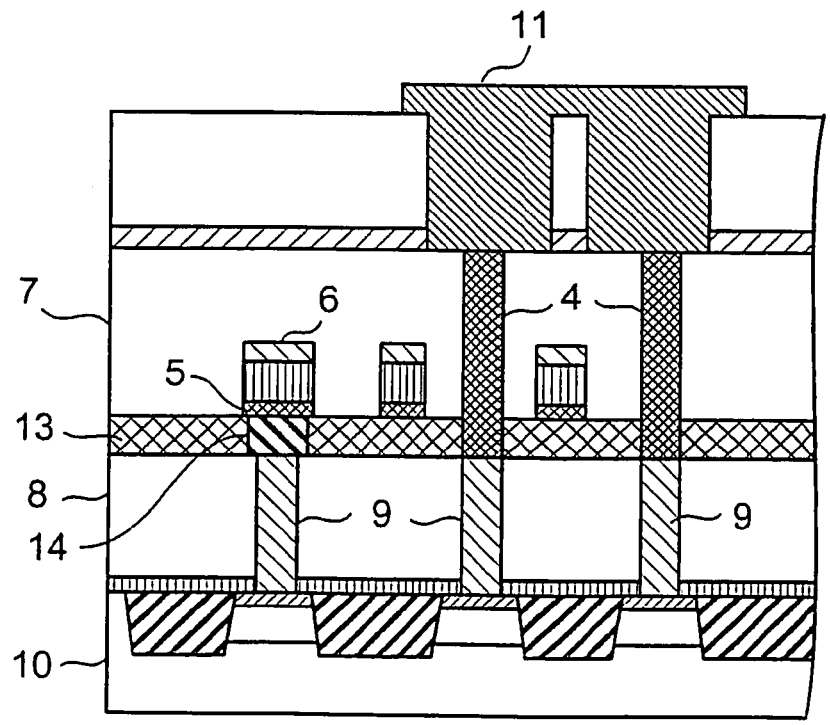
FIG. 19 is a cross sectional view of a conventional semiconductor device, in which the bit contact interlayer film 13 is further formed on cell contact interlayer film 8.

In this case, although the ideal situation is to have the rectangular shape shown in FIG. 17A as the mask 18a, reality may be that the rounded shape of the mask 18. Thus, although the ideally expected etched features by the etching process via using the masks 18a and 18b should have been the shapes shown as a bit line 6a and a barrier metal layer 5a in FIG. 17B, the actually obtainable etched features are the trapezoid shape, which are shown as a bit line 6b and a barrier metal layer 5b. In this occasion, after stripping the mask 18a and 18b, the actually obtainable geometry of the etched features may be that the width of the barrier metal layer 5b is wider than that of the bit line 6b, as shown in FIG. 17C. Therefore, as shown in FIG. 17D only the barrier metal layer 5b is selectively etched to form an inversely-tapered shape to remove the tapered portion of the barrier metal layer 5b wider than the bit line 6, as in the present embodiment, thereby providing larger room for the spacing for preventing the short circuit between the bit line 6 and the cell contact 9 or the capacitance contact 4. In addition to above, even if the etched barrier metal layer 5b actually has the unwanted trapezoid shape as shown in FIG. 17C, the barrier metal layer 5b is further selectively etched to form the shape of barrier metal layer 5b into the inversely-tapered shape, as shown in FIG. 17E, thereby ensuring a room for the spacing from the cell contact 9.

An example of the specific condition for etching the barrier metal layer 5 is shown as follows.

Temperature: 50 to 400 degree C. (e.g., 180 degree C.);
Pressure: 100 to 1,000 mTorr (e.g., 600 mTorr);
Power: 500 to 2,000 W (e.g., 1,200 W): and Volumetric flow rate of $O_2$/CF4 gases
O2: 500 to 2,000 sccm,
CF4: 5 to 30 sccm (e.g., $O_2$/CF4=1,000/12).

The present embodiment may be implemented alone, or may be applied to the semiconductor device of the above-described first and the second embodiments.

In summarize, the present embodiment, the following advantageous effects can be obtained.

Since wider spacings between the bit line and the cell contact and/or between the bit line and the capacitance contact can be presented by having a configuration including selectively etching the barrier metal film of the bit line to form an inversely-tapered shape, this configuration provides larger room for the spacing for preventing the short circuit between the bit line and the cell contact and/or between the bit line and the capacitance contact.

What is claimed is:
1. A semiconductor device comprising:
a semiconductor substrate;

a first insulating film covering said semiconductor substrate, said first insulating film having an upper surface;

a second insulating film selectively formed on said first insulating film to thereby expose a part of the upper surface of said first insulating film;

a first bit line on said second insulating film;

a barrier film between said second insulating film and said first bit line; and a nitride film covering a top and sides of said first bit line, sides of said barrier film, sides of said second insulating film, and the exposed part of the upper surface of said first insulating film.

2. A semiconductor device according to claim 1, further comprising:

a second bit line spaced from said first bit line;

a first hole selectively formed in said first insulating film;

a first conductive plug filling said first hole;

a second hole selectively formed in said first insulating film apart from said first hole;

a second conductive plug filling said second hole; and a third conductive plug between and in electrical contact with said first conductive plug and said second bit line.

3. A semiconductor device according to claim 2, wherein the barrier film also is between said third conductive plug and said second bit line.

4. A semiconductor device according to claim 2, further comprising:

a third insulating film covering said nitride film;

a fourth hole selectively formed in said third insulating film;

a fourth conductive plug filling said fourth hole in electrical contact with said second conductive plug; and a capacitor formed on said third insulating film in electrical contact with said fourth conductive plug.

5. A semiconductor device according to claim 1, wherein said second insulating film has substantially the same shape as said first bit line in a plan view.

6. A semiconductor device comprising:

a semiconductor substrate;

a first insulating film covering said semiconductor substrate;

a first hole selectively formed in said first insulating film;

a first conductive plug filling said first hole;

first and second bit lines formed over said first insulating film apart from each other;

a conductive film intervening between said first conductive plug and said first bit line to electrical connection therebetween;

a second insulating film intervening between said first insulating film and said second bit line, said second insulating film and said conductive film being formed apart from each other to form a gap that exposes a part of said first insulating film; and a nitride film filling said gap to cover said part of said first insulating film and being elongated over said first and second bit lines via side surfaces of said conductive film and said second insulating film.

7. A semiconductor device according to claim 6, further comprising:

a second hole selectively formed in said first insulating film apart from said first hole;

a second conductive plug filling said second hole;

a third insulating film covering said nitride film;

a third hole selectively formed in said third insulating film;

a third conductive plug filling said third hole in electrical contact with said second conductive plug;

a capacitor formed on said third insulating film in electrical contact with said third conductive plug.

8. A semiconductor device according to claim 6, wherein said nitride film contacts upper surfaces of said first bit line and said second bit line.

9. A semiconductor device comprising:

a semiconductor substrate;

a first insulating film covering said semiconductor substrate, said first insulating film having an upper surface;

a second insulating film selectively formed on said first insulating film to thereby expose a part of the upper surface of said first insulating film;

a bit line formed over said first insulating film with an intervention of said second insulating film;

a nitride film covering a top and sides of said bit line, sides of said second insulating film, and the exposed part of the upper surface of said first insulating film;

a third insulating film covering said nitride film;

a hole selectively formed in said third insulating film, said nitride film and said first insulating film to penetrate therethrough;

a conductive plug filling said hole; and a capacitor formed on said third insulating film in electrical contact with said conductive plug.

10. A semiconductor device according to claim 9, further comprising a barrier film intervening between said second insulating film and said bit line.

11. A semiconductor device according to claim 10, wherein said second insulating film has substantially the same shape as said bit line in a plan view.

* * * * *